United States Patent [19]
Siono et al.

[11] Patent Number: 5,373,519
[45] Date of Patent: Dec. 13, 1994

[54] SEMICONDUCTOR LASER DEVICE, AN OPTICAL DEVICE AND A METHOD OF PRODUCING THE SAME

[75] Inventors: Teruhiro Siono, Osaka; Hisahito Ogawa, Nara; Kazuhisa Yamamoto, Settsu, all of Japan

[73] Assignee: Matsushita Electric Industrial Co., Ltd., Osaka, Japan

[21] Appl. No.: 102,622

[22] Filed: Aug. 5, 1993

[30] Foreign Application Priority Data

Aug. 7, 1992 [JP] Japan .................................. 4-211069
Aug. 7, 1992 [JP] Japan .................................. 4-211070

[51] Int. Cl.$^5$ .............................................. H01S 3/18
[52] U.S. Cl. ...................................... 372/43; 359/572
[58] Field of Search .................... 372/43, 102; 359/572

[56] References Cited

U.S. PATENT DOCUMENTS

| | | | |
|---|---|---|---|
| 4,763,334 | 8/1988 | Shimada et al. | 372/43 |
| 4,873,697 | 10/1989 | Haeussler et al. | |
| 4,934,784 | 6/1990 | Kapany et al. | 359/572 |
| 5,138,495 | 8/1992 | Shiono et al. | 359/142 |
| 5,285,314 | 2/1994 | Futhey | 359/572 |

FOREIGN PATENT DOCUMENTS

| | | |
|---|---|---|
| 0199565 | 10/1986 | European Pat. Off. . |
| 0262435 | 4/1988 | European Pat. Off. . |
| 58-61692 | 4/1983 | Japan . |
| 60-185922 | 9/1985 | Japan . |
| 63-38272 | 2/1988 | Japan . |
| 63-164033 | 7/1988 | Japan . |
| 1-157585 | 6/1989 | Japan . |
| 3-116992 | 5/1991 | Japan . |

OTHER PUBLICATIONS

European Search Report (EP 93112488) dated Feb. 21, 1994.
*Sharp Semiconductor Data Book*, p. 17, Mar., 1992, Published by Sharp Kabushiki Kaisha, "Outline of Optical Semiconductor Elements" with partial English translation (which is cited in the specification, p. 1, lines 21-22 of the present application).

*Primary Examiner*—Rodney B. Bovernick
*Assistant Examiner*—Robert E. Wise
*Attorney, Agent, or Firm*—Ratner & Prestia

[57] ABSTRACT

A semiconductor laser device and an optical device is disclosed. The semiconductor laser device includes a semiconductor laser chip, an optical device, and a supporting member for supporting the semiconductor laser chip and the optical device. The optical device includes a reflection diffractive optical lens which diffracts part of the laser light emitted from the emitting end face of the semiconductor laser chip, to form diffracted light beams, and allows a diffracted light beam having a selected wavelength among the diffracted light beams to be incident on the emitting end face, whereby the wavelength of the laser light emitted from the semiconductor laser chip can be stabilized. The optical device includes a substrate having a first and a second main faces, a first optical element formed on either one main face, and a second optical element formed on the main face together with the first optical element. The second optical element has a reflection diffractive grating structure which reflects and diffracts part of laser light emitted from a semiconductor laser chip to form a plurality of orders of diffracted light beams, and allowing diffracted light beams having a selected wavelength among the plurality of orders of diffracted light beams to be incident on the emitting end face of the semiconductor laser chip, whereby the wavelength of laser light emitted from the semiconductor laser chip can be stabilized. A method of producing the semiconductor laser device and the optical device is also disclosed.

36 Claims, 11 Drawing Sheets

SEMICONDUCTOR LASER DEVICE, AN OPTICAL DEVICE AND A METHOD OF PRODUCING THE SAME

BACKGROUND OF THE INVENTION

1. Field of the Invention

The present invention relates to an optical device for a semiconductor laser, and a semiconductor laser device in which an optical device and a semiconductor laser chip are formed in an integrated manner. More particularly, the present invention relates to a semiconductor laser device having a small size and a stable structure in which there is no wavelength shift of a light source. In addition, the present invention relates to a method of producing such an optical device and to a method of producing such a semiconductor laser device.

2. Description of the Related Art

A semiconductor laser device is small and light, so that it is widely used as a light source for an optical disk apparatus and the like. An exemplary conventional semiconductor laser device is shown in FIG. 4 (see "SHARP Semiconductor Data Book", p. 17, 1992).

The semiconductor laser device shown in FIG. 4 includes a semiconductor laser chip 1, a cap 3, and a stem 8. When a current is caused to flow through the semiconductor laser chip 1, laser light 4 is emitted from an emitting end face 9 of the semiconductor laser chip 1. The laser light 4 is further emitted to the external of the semiconductor laser device through a glass plate 5 which is provided in a laser light emitting portion (opening) 11. The laser light 4 can be applied to various optical systems. A monitoring photodiode 10 is mounted on a member for supporting the cap 3 and the stem 8. The monitoring photodiode 10 monitors the intensity of laser light emitted from another end face of the semiconductor laser chip 1 opposite to the emitting end face 9.

The conventional semiconductor laser device as shown in FIG. 4 has a problem in that the oscillation wavelength may vary as the temperature of the laser chip changes.

SUMMARY OF THE INVENTION

The semiconductor laser device of this invention includes: a semiconductor laser chip having an emitting end face for emitting laser light; an optical device allowing the laser light to transmit therethrough; and a supporting member for supporting the semiconductor laser chip and the optical device in an arrangement that the laser light emitted from the emitting end face of the semiconductor laser chip is incident on the optical device, wherein the optical device includes a reflection diffractive optical means, and wherein the reflection diffractive optical means diffracts part of the laser light emitted from the emitting end face of the semiconductor laser chip, to form diffracted light beams, and allows a diffracted light beam having a selected wavelength among the diffracted light beams to be incident on the emitting end face.

In one embodiment of the invention, the part of the laser light diffracted by the reflection diffractive optical means is light in the peripheral portion of the laser light.

In another embodiment of the invention, the optical device further includes a transparent plate, and wherein the reflection diffractive optical means is a lens formed on a surface of the transparent plate, the lens being a ring-shaped lens having an opening.

In another embodiment of the invention, the optical device further includes another optical means provided in the opening of the ring-shaped lens.

In another embodiment of the invention, the transparent plate is disposed substantially parallel to the emitting end face of the semiconductor laser chip.

In another embodiment of the invention, the supporting member has a portion for supporting the semiconductor laser chip, and a cap provided on the portion to cover the semiconductor laser chip, the cap having an opening for allowing at least part of the laser light emitted from the emitting end face of the semiconductor laser chip.

In another embodiment of the invention, the transparent plate is provided on the inner side of the cap to cover the opening of the cap.

In another embodiment of the invention, in the cap, the reflection diffractive optical lens faces the emitting end face of the semiconductor laser chip.

In another embodiment of the invention, the reflection diffractive optical lens is provided on one face of a pair of faces of the transparent plate, the one face not facing the emitting end face of the semiconductor laser chip.

In another embodiment of the invention, the transparent plate is provided on the outer side of the cap to cover the opening of the cap.

In another embodiment of the invention, the semiconductor laser chip includes another end face parallel to the emitting end face, the end face having a higher reflectance than that of the emitting end face.

In another embodiment of the invention, a power ratio of light allowed to be incident on the emitting end face by the reflection diffractive optical means to laser light oscillated in the semiconductor laser chip is equal to or larger than a reflectance of the emitting end face of the semiconductor laser chip.

According to another aspect of the invention, a semiconductor laser device is provided. The semiconductor laser device includes: a semiconductor laser chip having an emitting end face for emitting laser light; and a supporting member for supporting the semiconductor laser chip, wherein the supporting member includes a portion for supporting the semiconductor laser chip and a cap for covering the semiconductor laser chip, and wherein the cap includes an opening for allowing part of the laser light emitted from the emitting end face of the semiconductor laser chip, a transparent plate which covers the opening of the cap, and an optical device provided on the transparent plate.

According to another aspect of the invention, an optical device is provided. The optical device includes: a substrate having a first main face and a second main face; a first optical element formed on either one main face of the first main face or the second main face of the substrate; and a second optical element formed on the main face together with the first optical element, wherein the second optical element has a reflection diffractive grating structure, the second optical element receiving part of laser light emitted from an emitting end face of a semiconductor laser chip, reflecting and diffracting the part of the laser light to form a plurality of orders of diffracted light beams, and allowing diffracted light beams having a selected wavelength among the plurality of orders of diffracted light beams to be incident on the emitting end face of the semiconductor laser chip.

In one embodiment of the invention, the first optical element is an optical element having a diffractive grating structure.

In another embodiment of the invention, the first optical element is a transmission element, and wherein the first optical element receives part of the laser light, and emits the part of the laser light to the external of the substrate.

In another embodiment of the invention, the second optical element is formed around the first optical element.

In another embodiment of the invention, the first optical element is a micro Fresnel lens.

In another embodiment of the invention, the first optical element is a reflection element, and wherein the first optical element receives part of the laser light and reflects the part of the laser light in a direction in which the semiconductor laser chip is not disposed.

In another embodiment of the invention, an angle formed by the main face on which the first and second optical elements are formed and the emitting end face of the semiconductor laser chip is smaller than 90°.

In another embodiment of the invention, the second optical element is formed around the first optical element.

In another embodiment of the invention, the second optical element is formed at a distant position from the first optical element.

In another embodiment of the invention, the optical device further includes reflection means on the other one of the first and second main faces on which the first and second optical elements are not formed, wherein the second optical element receives the part of the laser light emitted from the emitting end face of the semiconductor laser chip via the reflection means, and allowing the diffracted light beams having the selected wavelength among the plurality of orders of diffracted light beams to be incident on the emitting end face of the semiconductor laser chip via the reflection means.

In another embodiment of the invention, the optical device further includes reflection means on the other one of the first and second main faces on which the first and second optical elements are not formed, wherein the second optical element receives the part of the laser light emitted from the emitting end face of the semiconductor laser chip, and allowing the diffracted light beams having the selected wavelength among the plurality of orders of diffracted light beams to be incident on the emitting end face of the semiconductor laser chip.

In another embodiment of the invention, the reflection means receives zero-order diffracted light beams among the plurality of orders of diffracted light beams from the second optical element, and reflects the zero-order diffracted light beams, whereby the zero-order diffracted light beams are allowed to be incident on the first optical element.

In another embodiment of the invention, the first optical element forms other diffracted light beams from the zero-order diffracted light beams which are received from the second optical element via the reflection means, and emits the other diffracted light beams to the external of the substrate.

In another embodiment of the invention, the first optical element forms other diffracted light beams from the zero-order diffracted light beams which are received from the second optical element via the reflection means.

In another embodiment of the invention, the optical device further includes reflection means on the other one of the first or second main face on which the first and second optical elements are not formed, wherein the first optical element receives the laser light emitted from the emitting end face of the semiconductor laser chip via the reflection means, and collimates the laser light so as to be parallel light, and wherein the second optical element receives the parallel light via the reflection means to form the plurality of orders of the diffracted light beams, and allows the diffracted light beams having the selected wavelength among the plurality of orders of diffracted light beams to be incident on the emitting end face of the semiconductor laser chip via the reflection means and the first optical element.

In another embodiment of the invention, the optical device further includes reflection means on the other one of the first or second main face on which the first and second optical elements are not formed, wherein the first optical element receives the laser light emitted from the emitting end face of the semiconductor laser chip, and collimates the laser light so as to be parallel light, and wherein the second optical element receives the parallel light via the reflection means to form the plurality of orders of the diffracted light beams, and allows the diffracted light beams having the selected wavelength among the plurality of orders of diffracted light beams to be incident on the emitting end face of the semiconductor laser chip via the reflection means and the first optical element.

In another embodiment of the invention, the second optical element is a linear grating having a uniform period.

In another embodiment of the invention, the laser light emitted from the emitting end face of the semiconductor laser chip is elliptical in section perpendicular to an emitting direction, and wherein the main face of the first or second main face of the substrate on which the first and second optical elements are formed is perpendicular to the plane which includes both a major axis of the ellipse and the emitting direction.

In another embodiment of the invention, a power ratio of light allowed to be incident on the emitting end face by the second optical element to laser light oscillated in the semiconductor laser chip is equal to or larger than a reflectance of the emitting end face of the semiconductor laser chip.

In another embodiment of the invention, the optical device further includes: reflection means on the other one of the first or second main face on which the first and second optical elements are not formed; an objective lens formed on the substrate, the objective lens receiving the laser light propagated in a zigzag manner via the reflection means, and converging the laser light onto an optical information recording medium; and photodetector means for detecting light reflected by the optical information recording medium, the photodetector means producing a signal which includes information recorded on the information recording medium.

In another embodiment of the invention, the optical device further includes: reflection means on the other one of the first or second main face on which the first and second optical elements are not formed; an objective lens formed on the substrate, the objective lens receiving the laser light propagated in a zigzag manner via the reflection means, and converging the laser light onto an optical information recording medium; and photodetector means for detecting light reflected by the optical information recording medium, the photodetector means producing a signal which includes information recorded on the information recording medium.

In another embodiment of the invention, the optical device further includes positional signal detecting means formed on the substrate, the positional signal detecting means receiving the light reflected by the optical information recording medium, and dividing the light into a plurality of portions, wherein the photodetector means includes at least four photodetectors, the photodetectors receiving the plurality of portions of the light, and producing a positional signal based on the plurality of portions of the light.

In another embodiment of the invention, the optical device further includes positional signal detecting means formed on the substrate, the positional signal detecting means receiving the light reflected by the optical information recording medium, and dividing the light into a plurality of portions, wherein the photodetector means includes at least four photodetectors, the photodetectors receiving the plurality of portions of the light, and producing a positional signal based on the plurality of portions of the light.

According to another aspect of the invention, a method of producing an optical device of the above-mentioned type is provided. The method includes the steps of: producing a metal mold for defining a surface pattern of the first and second optical elements; and duplicating the substrate having the first and second optical elements with the metal mode.

Thus, the invention described herein makes possible the advantages of (1) providing an optical device, (2) providing a semiconductor laser device having a small size in which wavelength fluctuation of a light source is not caused, (3) providing a method of producing such an optical device, and (4) providing a method of producing such a semiconductor laser device.

These and other advantages of the present invention will become apparent to those skilled in the art upon reading and understanding the following detailed description with reference to the accompanying figures.

DESCRIPTION OF THE PREFERRED EMBODIMENTS

Example 1

Figure 1:
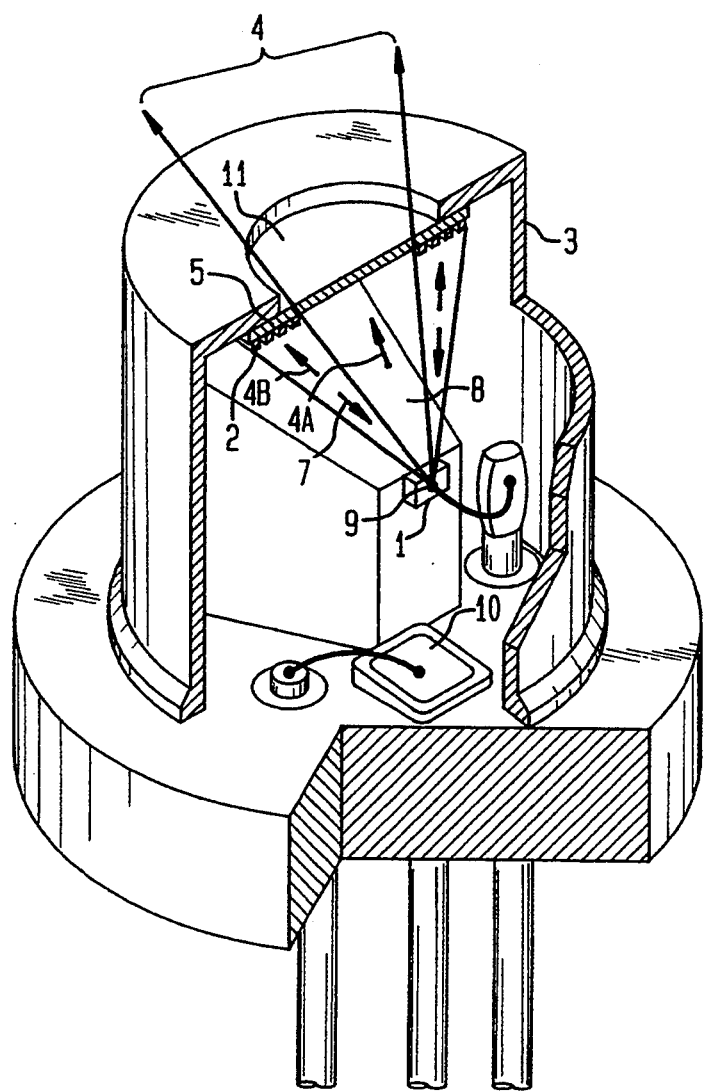
FIG. 1 is a view showing an internal construction of a semiconductor laser device of a first example according to the invention.
Figure 2A:
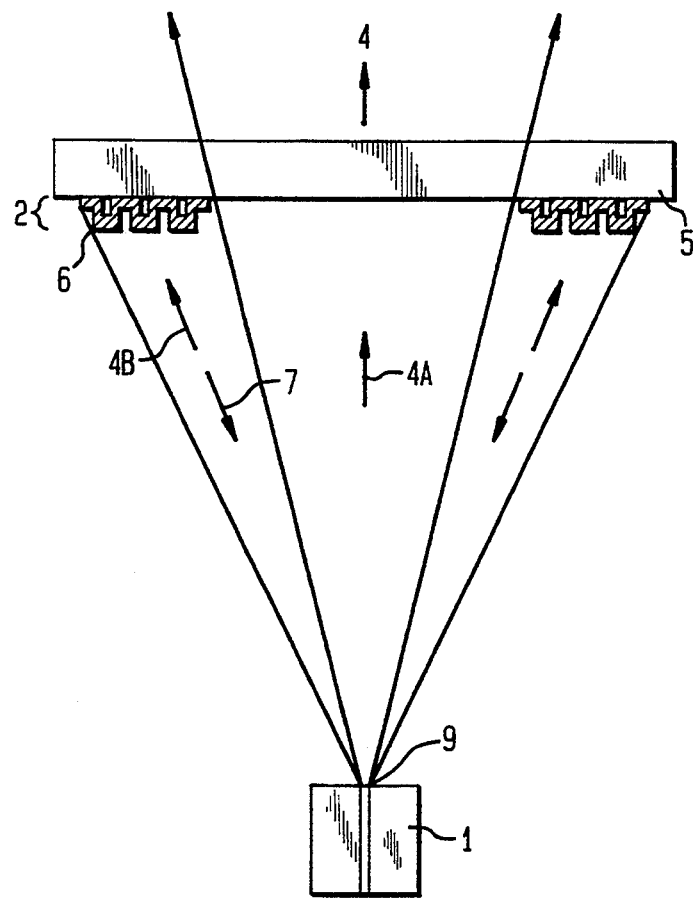
FIG. 2A is a cross-sectional view illustrating an operation of the semiconductor laser device of the first example according to the invention.
Figure 2B:
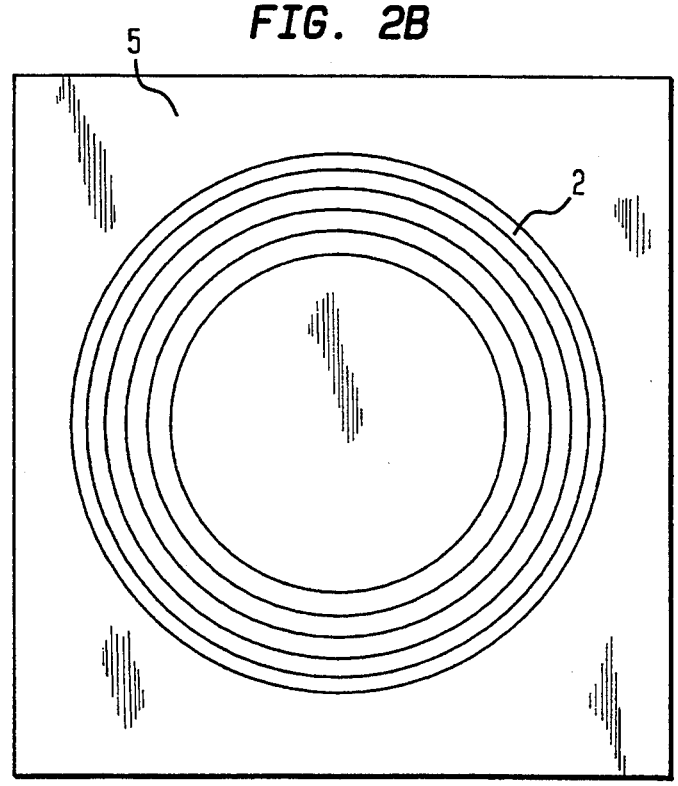
FIG. 2B is a view showing a shape of a reflection diffractive optical lens formed on the lower face of a glass plate in the first example.

A semiconductor laser device of a first example according to the invention will be described with reference to FIGS. 1, 2A, and 2B. In the first example, a glass plate 5 having a thickness of, for example, 0.3 millimeters (mm) is provided on an inner face of a cap 3. On an outer peripheral portion of a back face (which faces a semiconductor laser chip 1) of the glass plate 5, a ring-shaped reflection diffractive optical lens 2 is formed. A stem 8 which also serves as a heat sink is disposed directly under the optical lens 2. The semiconductor laser chip 1 is provided on the stem 8. By forming the reflection lens 2 on the back face of the glass plate 5, the lens 2 can be prevented from being damaged. Moreover, even if metal is used as a material of a reflection layer 6 for covering the surface of the lens 2, oxidation of the reflection layer 6 can be prevented due to the shield effect by the cap 3. A monitoring photodiode 10 is mounted on a member for supporting the cap 3 and the stem 8. The monitoring photodiode 10 monitors the intensity of laser light emitted from an end face of the semiconductor laser chip 1 opposite to a light emitting end face 9. The end face has a higher reflectance than that of the emitting end face 9 of the semiconductor laser chip 1. As a result, the laser power for monitoring, which is emitted from the end face having a relatively higher reflectance is small enough, so that the laser power emitted from the end face 9 can be increased.

The reflection diffractive optical lens 2 has a ring-shaped aperture of, for example, 1 mm—1.3 mm. A focal length of the reflection diffractive optical lens 2 is, for example, 1 mm at a wavelength of, for example, 0.780 $\mu$m. In this case, the lens 2 is designed so that light generated from a point source which is disposed away from the lens 2 by a distance of, for example, 2 mm can be focused on the same point with a folded optical path. The optical lens 2 is composed of gratings with a plurality of concentric circular grooves. Each of the grooves is rectangular in section and has a groove depth of, for example, 0.2 $\mu$m. On the optical lens 2, the reflection layer 6 which is made of, for example, a metal layer such as Ag, Al or Au, or a multilayer dielectric film is provided. The distance between the grooves (grating period) becomes gradually smaller toward the outermost circular groove along the radial direction, for example, from 0.87 $\mu$m to 0.72 $\mu$m.

Light in the peripheral portion 4B of light (e.g., a center wavelength thereof is about 0.78 μm) emitted from the light emitting end face 9 of the semiconductor laser chip 1 is incident on the reflection diffractive optical lens 2. The light in the peripheral portion 4B which is incident on the reflection diffractive optical lens 2 is reflected and diffracted by the reflection diffractive optical lens 2, for example, with diffraction efficiency of 40%. Among the reflected and diffracted light beams, only a reflected first-order diffracted light beam 7 having a selected wavelength (e.g., 0.780 μm) is converged on the light emitting end face 9 of the semiconductor laser chip 1, and entered into the semiconductor laser chip 1 (the power of entering light is 5% to 20% of the total power of emitted light). In this example, the input optical power may be set to be, for example, 5% to 33% of the total power of emitted light. If the input optical power is set to be substantially equal to or higher than the reflectance of the light emitting end face 9 (e.g., 5%), the wavelength shift can advantageously be suppressed. Other first-order diffracted light beams having other wavelengths (e.g., 0.77 or 0.79 μm) are out of focus on the light emitting end face 9. As the wavelength deviates from the selected wavelength, the power of light which enters into the semiconductor laser chip 1 decreases. By the input of the light having the selected wavelength to the semiconductor laser chip 1, a wavelength of laser oscillation is made equal to the selected wavelength. Thus, the laser light having a stable wavelength is generated by laser oscillation from the light emitting end face 9. The laser light in the center portion 4A is emitted to the external of the semiconductor laser device through the laser light emitting portion 11, i.e., the glass plate 5. The laser light 4 is utilized for, for example, an optical system such as a pickup used in an optical disk apparatus. In this example, the first-order diffracted light beams are used among the reflected and diffracted light beams. Alternatively, diffracted light beams with any other order, such as second-order diffracted light beams can also be used.

The aperture of the reflection diffractive optical lens 2 in this example is formed into a ring shape, so that the power of the light in the center portion 4A of the light emitted from the semiconductor laser chip 1 cannot be reduced. The light in the peripheral portion 4B is blocked by the cap 3, and the light in the peripheral portion 4B cannot be used in many conventional cases. The semiconductor laser device of this example has an advantage in that the light in the peripheral portion 4B is effectively utilized. Generally, the power distribution of the laser light emitted from the semiconductor laser chip 1 is elliptical, not circular, so that the reflection lens 2 may alternatively be partly formed so as to reflect the elliptical light.

If the distance from the light emitting end face 9 of the semiconductor Laser chip 1 to the back face of the glass plate 5 on which the lens 2 is formed is represented by a, a phase shift function $\Phi(r)$ of the reflection diffractive optical lens 2 in this example is given as follows:

$$\Phi(r) = \lambda/\pi \cdot (\sqrt{(a^2 + r^2)} - a) - 2m\pi,$$

where $\lambda$ is a wavelength of light, r is the distance from the center of the lens 2, and m is an integer which satisfies a condition of $0 \leq \Phi \leq 2\pi$. The above function is approximately the same as that for a lens having a focal length $f = a/2$.

For producing the reflection diffractive optical lens 2, a known electron-beam lithography has been used. In more detail, an electron-beam resist made of, for example, PMMA, CMS or the like is first spin-coated on the glass plate 5. Then, electron beams are concentrically radiated to the resist. After development, the resist has various film thicknesses, so as to form a grating pattern. Then, the reflection layer 6 is deposited on the grating. The producing method is finished. In addition, the method for mass production is as follows. First, a metal mold having the grating pattern without reflection layer 6 is produced using the original optical lens fabricated by electron-beam lithography. A grating is duplicated with the metal mold, for example, by using a UV-setting resin. On the duplicated grating, a reflection layer 6 is deposited, whereby an optical lens 2 having the same grating pattern as that of the original can be produced. According to the above-described method, the semiconductor laser device of this example can be mass-produced at low cost. After development, a grating pattern may be directly formed on the surface of a glass plate by an ion beam etching method, an etching method with hydrofluoric acid, or the like by using the patterned resist as an etching mask. The resulting optical lens 2 is thermally stable as compared with an optical lens 2 having a grating structure made of resist.

In this example, the grating pattern constituting the reflection diffractive optical lens 2 is circular. However, since the diverging spherical wave of the laser light emitted front the semiconductor laser chip 1 generally has astigmatism, the grating pattern with an elliptical shape can compensate the aberration of astigmatism.

As described above, by providing a reflection diffractive optical lens on a glass plate for shielding an opening of a cap, a semiconductor laser device without wavelength shift can be provided.

Instead of a reflection diffractive optical lens, an optical device of another type can be provided on the glass plate for shielding the opening of the cap. For example, a transmission diffractive optical lens may be formed on the grass plate. The integration of an optical device and a shielding glass plate provides a compact semiconductor laser device.

Example 2

Figure 3:
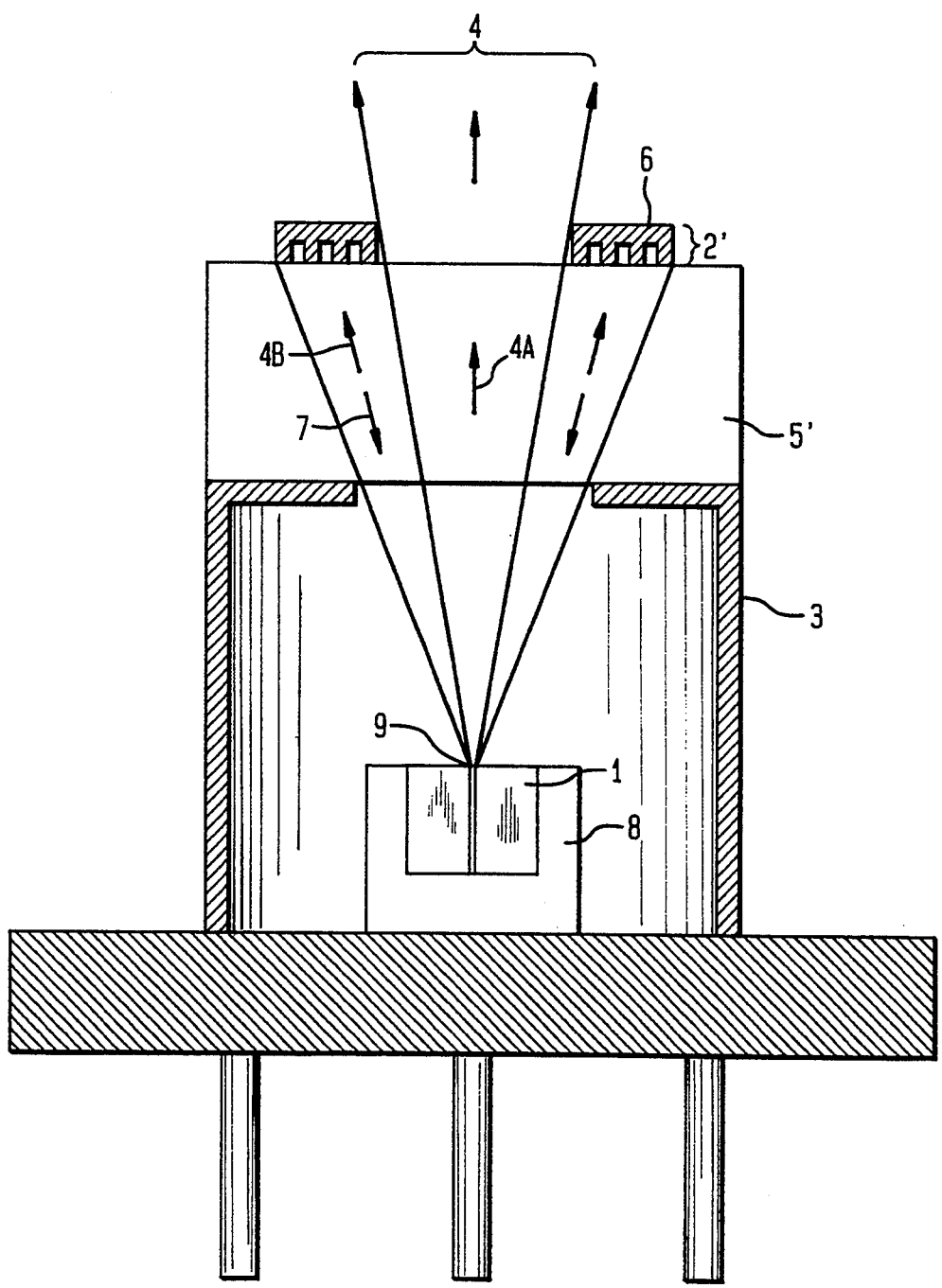
FIG. 3 is a cross-sectional view showing a construction of a semiconductor laser device of a second example according to the invention.
Figure 4:
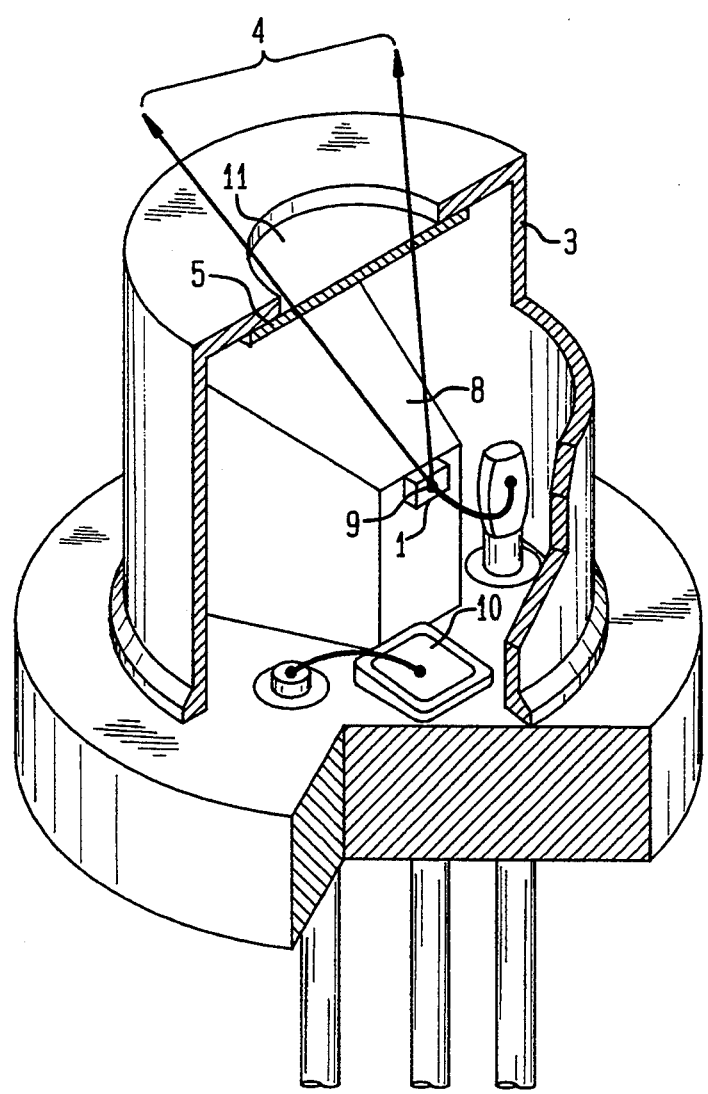
FIG. 4 is a view showing an internal construction of a conventional semiconductor laser device.

FIG. 3 is a cross-sectional view showing a structure of a semiconductor laser device of a second example according to the invention, and illustrating the convergence of light. Differences between the semiconductor laser device of this example and that of the first example will be described below. In this example, a glass plate 5' having a thickness of 2 mm is placed on a cap 3. A reflection diffractive optical lens 2' is provided on a face (which does not face a semiconductor laser chip 1) of the glass plate 5'. With this structure in which the glass plate 5' is provided on the cap 3, the reflection diffractive optical lens 2' is separated from the semiconductor laser chip 1 by the glass plate 5'. Therefore, even if the temperature of the inside of the cap 3 rises, the temperature at the position where the reflection diffractive optical lens 2' is disposed does not so rise. Thus, there is no problem if the reflection diffractive optical lens 2' is formed of a synthetic resin. In this example, since the glass plate 5' is provided on the cap 3, the position of the reflection diffractive optical lens 2' and the position of the semiconductor laser chip 1 can more easily be adjusted. Moreover, in this example, the distance from the semiconductor laser chip 1 to the lens 2' is larger than that in the first example, so that the selected wavelength is well separated from non-selected wavelengths, which allows the wavelength stability to increase. In this example, the glass plate 5' is exposed. However, if a package is provided so as to cover the glass plate 5', the durability is improved. Moreover, the semiconductor laser device may be provided with a glass plate 5 on the inner face of the cap 3, as in the conventional example.

Example 3

Figure 5A:
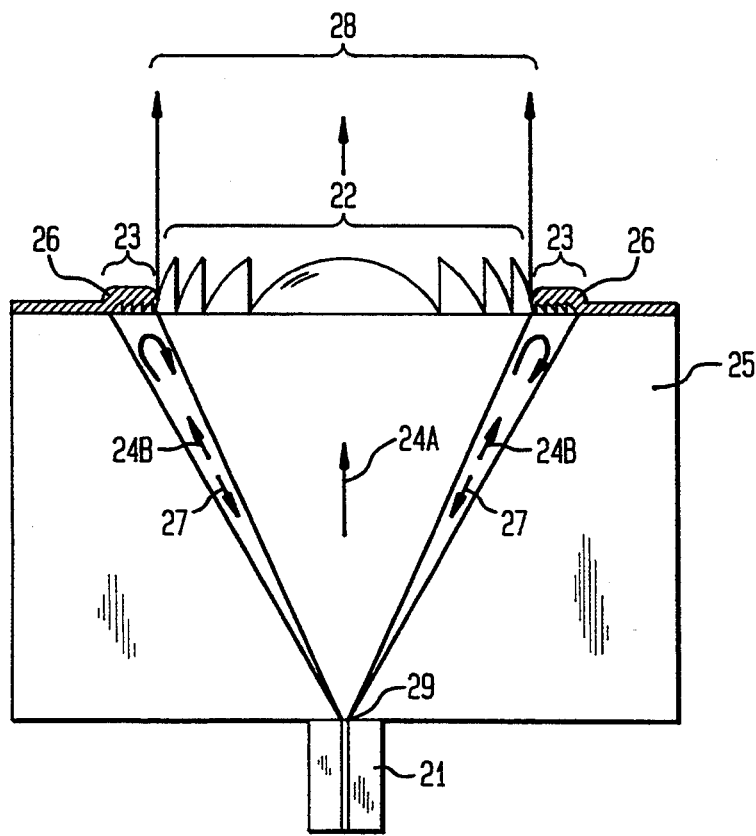
FIG. 5A is a cross-sectional view showing a construction of an optical device of a third example according to the invention.
Figure 5B:
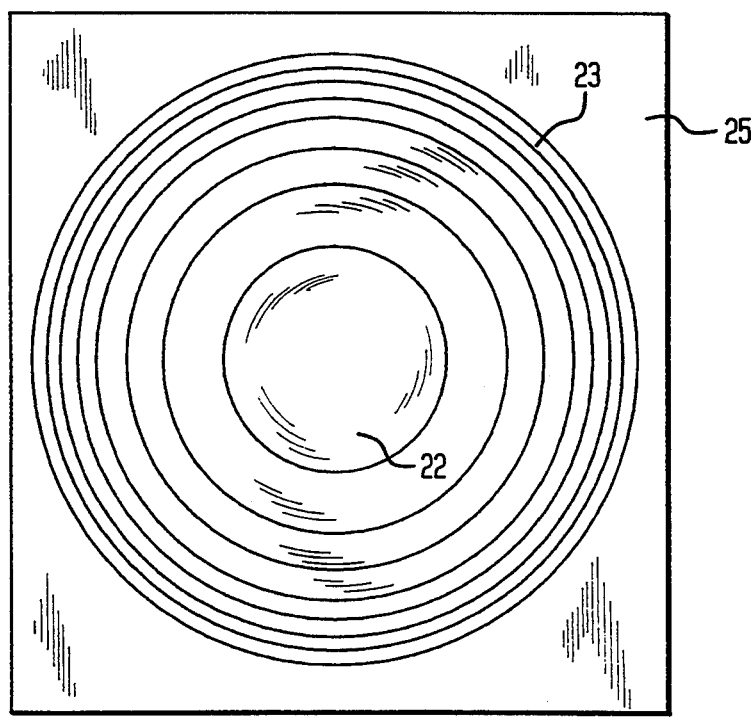
FIG. 5B is a top view of the third example.
Figure 6:
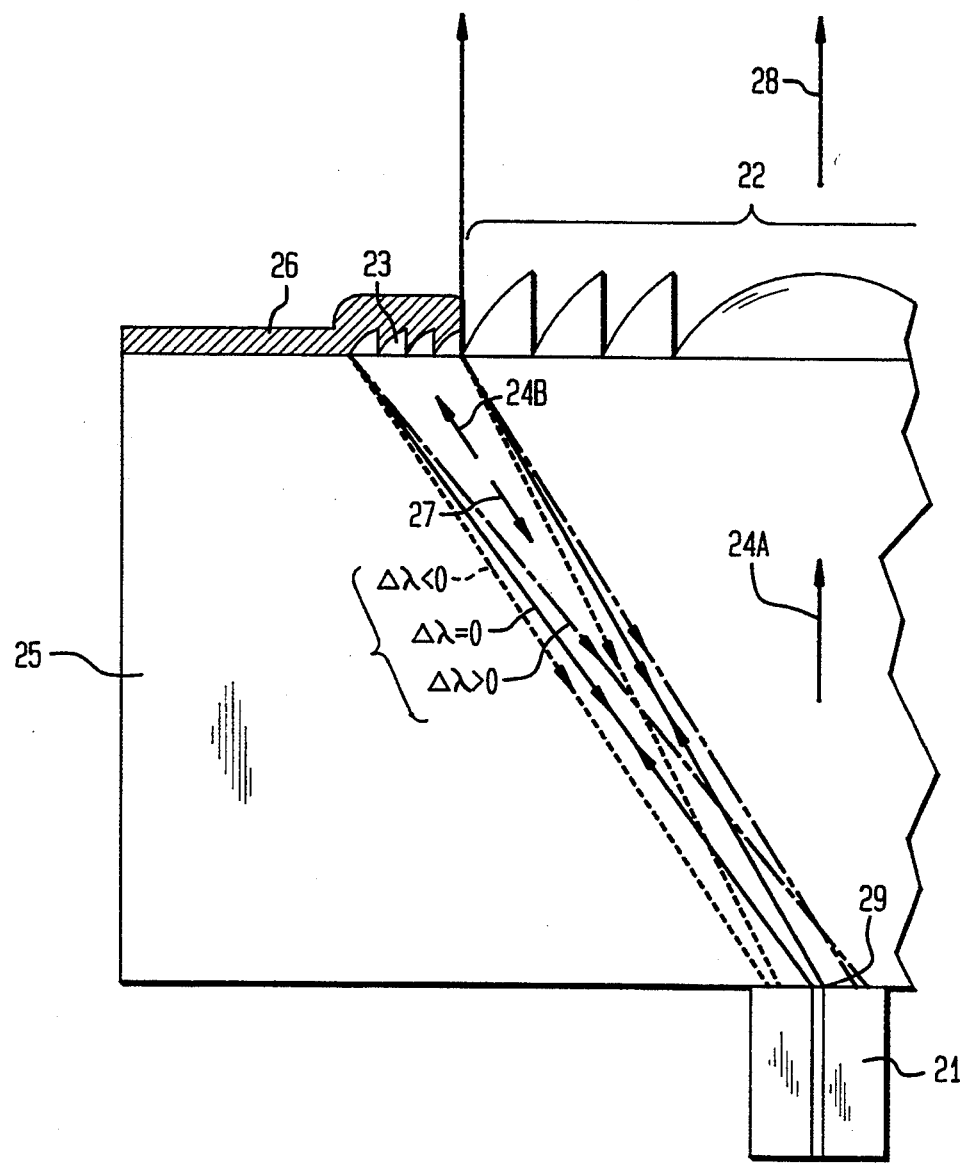
FIG. 6 is a side view illustrating the reflection and diffraction of light having various wavelengths in the optical device of the third example according to the invention.

FIGS. 5A and 5B are cross-sectional and top views, respectively, showing a construction of an optical device of a third example according to the invention. FIG. 6 is a side view illustrating reflection and diffraction of light beams having various wavelengths in the optical device of the third example according to the invention. The third example of the invention will be described below with reference to FIGS. 5A, 5B and 6.

As is shown in FIGS. 5A and 5B, the optical device of this example includes a glass substrate 25 having a thickness of, for example, 4.5 mm, a first optical element 22 formed on the surface of the glass substrate 25, and a second optical element 23 around the first optical element 22. On a back face of the substrate 25, a semiconductor laser chip 21 is provided directly under the first optical element 22. The first optical element 22 is a transmission micro Fresnel lens having an aperture of, for example, 1 mm. The micro Fresnel lens is designed so as to collimate light which is generated from a point source. The first optical element 22 has, for example, a grating structure including a plurality of concentric grooves and having a saw-tooth shape in section. Each of the grooves has, for example, a maximum depth of 1.3 μm. The second optical element 23 is a reflection diffractive optical lens for converging the light. The lens has a ring-shaped aperture, of which an inner diameter is 1 mm and an outer diameter is 1.3 mm, for example. The lens is designed so that light generated from a point source can be focused on the same point with a folded optical path. The second optical element 23 is composed of reflection gratings with a plurality of concentric circular grooves having a saw-tooth shape in section. Each of the grooves has, for example, a maximum depth of 0.24 μm. On the second optical element 23, a reflection layer 26 which is made of, for example, a metal layer such as Ag, Al or Au, or a multilayer dielectric film is provided. The grating period becomes gradually smaller toward the outermost circular groove along a radial direction, for example, from 2.4 μm to 1.8 μm. The structure of the second optical element 23 is the same as that of the outer peripheral portion of a usual reflection micro Fresnel lens.

Light in the peripheral portion 24B of light (e.g., a center wavelength thereof is about 0.78 μm) emitted from a light emitting end face 29 of the semiconductor laser chip 21 is incident on the second optical element 23 through the substrate 25. The light in the peripheral portion 24B which is incident on the second optical element 23 is reflected and diffracted by the second optical element 23, for example, with diffraction efficiency of 50%. Among the reflected and diffracted light beams, only a reflected first-order diffracted light beam 27 having a selected wavelength (e.g., 0.780 μm) is converged on the light emitting end face 29 of the semiconductor laser chip 21, and entered into the semiconductor laser chip 21. The optimal input optical power to the semiconductor laser chip 21 depends on the reflectance of the light emitting end face 29. In this example, the input optical power is set to be, for example, 5% to 23% of the total power of emitted light. If the input optical power is set to be substantially equal to or higher than the reflectance of the light emitting end face 29 (e.g., 5%), the wavelength shift can advantageously be suppressed. FIG. 6 shows the convergence of light beams with various wavelengths, where the selected wavelength is $\lambda$, and the wavelength difference from $\lambda$ is $\Delta\lambda$. A light beam indicated by a solid line has the same wavelength as the selected one $\lambda$ ($\Delta\lambda=0$). Light beams indicated by a one-dot chain line and a broken line have wavelengths longer and shorter than the selected wavelength $\lambda$ ($\Delta\lambda>0$ and $\Delta\lambda<0$), respectively. First-order diffracted light beams having other wavelengths (e.g., 0.77 or 0.79 μm) are not incident on the light emitting end face 29, because angles of diffraction are different from that of the wavelength $\lambda$ (a focal length is decreased when $\Delta\lambda>0$, and it is increased when $\Delta\lambda<0$). By the input of the light having the selected wavelength to the semiconductor laser chip 21, a wavelength of laser oscillation in the semiconductor laser chip 21 is made equal to the selected wavelength. Light in the center portion 24A is collimated by the first optical element 22. The light 28 is utilized for, for example an optical system such as a pickup used in an optical disk apparatus. In this example, the first-order diffracted light beams are used among the reflected and diffracted light beams. Alternatively, diffracted light beams with any other order, such as second-order diffracted light beams can be used.

The second optical element 23 is used for the feedback of the emitted light to the semiconductor laser chip 21. The aperture of the second optical element 23 in this example is formed into a ring shape on the outer peripheral portion of the substrate 25, so that the power of the light in the center portion 24A of the light emitted from the semiconductor laser chip 21 cannot be reduced. The light in the peripheral portion 24B is intentionally unused for the beam shape in many conventional cases. The optical device of this example has an advantage in that the light in the peripheral portion 24B is effectively utilized. Generally, the power distribution of the laser light emitted from the semiconductor laser chip 21 is elliptical, not circular, so that the second optical element 23 may alternatively be partly formed so as to reflect the elliptical light.

As described above, in this example, the second optical element 23 which serves as a grating and a lens for selecting a wavelength of light incident on the light emitting end face 29 of the semiconductor laser chip 21 and the first optical element 22 for collimating the emitted light are formed on one and the same substrate 25. Accordingly, the resulting optical device is miniaturized, and the positions of these plurality of optical elements can be accurately and easily adjusted to each other by using a known planar technique. In addition, the positions of the plurality of optical elements can be adjusted during the production of the optical device, so that it is unnecessary to separately produce the optical elements and then to assemble them.

If the distance from the light emitting end face 29 of the semiconductor laser chip 21 to the face of the substrate 25 on which the elements 22 and 23 are formed is represented by a, a phase shift function $\phi(r)$ of the second optical element 23 in this example is given as follows:

$$\Phi(r) = \lambda/(n\pi) \cdot (\sqrt{(a^2 + r^2)} - a) - 2m\pi,$$

where λ is a wavelength of light, r is the distance from the center of the second optical element 23, n is the refractive index of the substrate 25, and m is an integer which satisfies the condition of $0 \leq \Phi \leq 2\pi$. The above function is approximately the same as that for a lens having a focal length f=a/2.

For producing the first and second optical elements 22 and 23, an electron-beam lithography which is one of the known planar techniques has been used. In more detail, an electron-beam resist made of, for example, PMMA, CMS or the like is first spin-coated on the glass substrate 25. Then, electron beams are concentrically radiated to the resist correspondingly to the first and the second optical elements 22 and 23. After development, the resist has various film thicknesses. Then, the reflection layer 26 is deposited only on the second optical element 23. The producing method is finished. In addition, the method for mass production is as follows. First, a metal mold having a pattern of the first and the second optical elements 22 and 23 without reflection layer 26 is produced using the original optical elements 22 and 23 fabricated by electron-beam lithography. The optical elements 22 and 23 are duplicated with the metal mold, for example, by using a UV-setting resin. Only on the duplicated optical element 23, the reflection layer 26 is deposited, whereby the optical elements 22 and 23 having the same pattern as the original one can be produced, and the relative positional relationship therebetween is maintained. According to the above-described method, the optical device of this example can be mass-produced at low cost. After development, the pattern may be directly formed on the surface of the glass substrate 25 by an ion beam etching method, an etching method with hydrofluoric acid, or the like by using the patterned resist as an etching mask. The resulting optical elements 22 and 23 are thermally stable as compared with optical elements 22 and 23 having a grating structure made of resist.

In this example, the grating pattern constituting the optical elements 22 and 23 is circular. However, since the diverging spherical wave of the laser light emitted from the semiconductor laser chip 21 generally has astigmatism, the grating pattern with an elliptical shape can compensate the aberration of astigmatism. In addition, in this example, the grating which constitutes the optical elements 22 and 23 has a saw-tooth shape in section. Alternatively, even if the cross section of the grating is rectangular, the same effects can be attained while the diffractive efficiency is somewhat decreased. In addition, in this example, a diffractive lens is used as the first optical element 22. Alternatively, even if a refractive plano-convex lens is used, the integration effect can be attained while the lens thickness is somewhat increased.

By the provision of the second optical element 23, the position of the semiconductor laser chip 21 is adjusted so that the first-order diffracted light beam 27 reflected from the second optical element 23 can be incident on the light emitting end face 29. Therefore, the position adjustment for the first optical element 22 and the semiconductor laser chip 21 can easily be performed. In addition, if the wavelength of the collimated emitted light 28 is monitored and the position adjustment is performed in such a manner that the wavelength is equal to a design wavelength, an automatic position adjustment can easily be performed.

Example 4

Figure 7A:
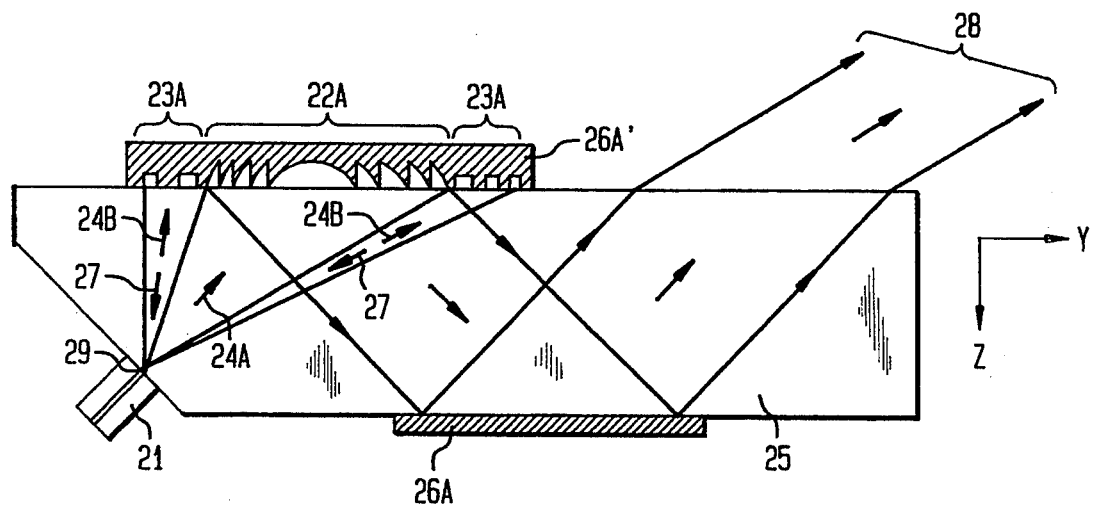
FIG. 7A is a cross-sectional view showing a construction of an optical device of a fourth example according to the invention.
Figure 7B:
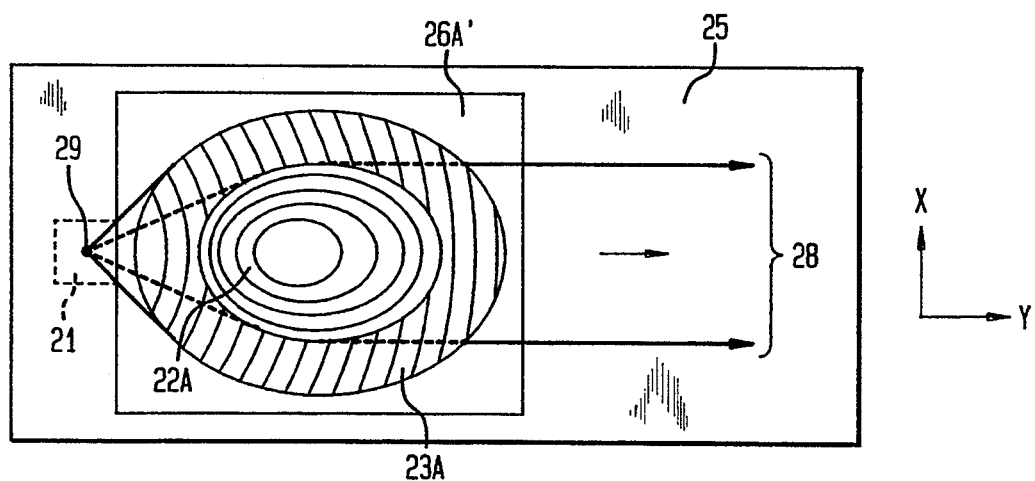
FIG. 7B is a top view of the fourth example.

FIGS. 7A and 7B are cross-sectional and top views showing a basic construction of an optical device of a fourth example, respectively. The optical device is different from the optical device of the third example in the following manner.

In this example, as a substrate 25, a glass plate having a thickness of, for example, 4 mm is used. The lower left portion of the substrate 25 is cut away at an angle of 30° with respect to the lower face of the substrate 25. A semiconductor laser chip 21 is provided on the cut face in such a manner that a light emitting end face 29 thereof is parallel to the cut face. Laser light 24A and 24B emitted from the light emitting end face 29 of the semiconductor laser chip 21 is incident on optical elements 22A and 23A which are formed on the upper face of the substrate 25 at an oblique angle of, for example, 30° with respect to the vertical direction. Regarding the light 24B incident on the second optical element 23A which is formed around the first optical element 22A, the same as in the third example, a reflected first-order diffracted light beam 27 having a selected wavelength is incident on the light emitting end face 29, and thus the wavelength of the laser light is made equal to the selected wavelength. The light 24A incident on the first optical element 22A is reflected therefrom so as to be collimated. The collimated light is reflected by a reflection layer 26A which is provided on the lower face of the substrate 25. The reflected light is emitted obliquely from the surface of the substrate 25 to the external thereof as emitted light 28. The power distribution of laser light emitted from a usual semiconductor laser chip is elliptical. The position of the semiconductor laser chip 21 is adjusted so that the major axis of the ellipse of the laser light is parallel to the plane which includes an optical axis of the laser light propagated through the substrate 25 (that is, an optical axis of laser Light from the semiconductor laser chip 21 to the first optical element 22A) and a line perpendicular to the upper face of the substrate 25 on which the first and second optical elements 22A and 23A are formed. Accordingly, the ellipticity is reduced (i.e., the sectional shape of the collimated light 28 becomes closer to a circle), and a beam shaping effect is attained.

The first optical element 22A is a reflection diffractive optical microlens for obliquely incident light (e.g., at an obliquely incident angle of 30°) having a length of 1 mm along a major axis and a length of 0.86 mm along a minor axis. The second optical element 23A is also a reflection diffractive optical microlens for obliquely incident light, for example, having a length of 1 to 1.3 mm along a major axis and a length of 0.86 to 1.1 mm along a minor axis. On both the optical elements 22A and 23A, a reflection layer 26A ' is deposited. The grating of the optical element 22A has a saw-tooth shape in section. The plane pattern of the grating of the optical element 22A has an elliptical shape. The center position of the ellipse is gradually shifted in the y direction (along the major axis thereof away from the semiconductor laser chip 21) toward the circumferential portion. Therefore, in this construction, the astigmatism and the coma caused by the obliquely incident light are corrected. The second optical element 23A has a rectangular shape in section. In the top view of the second optical element 23A, the period is increased, but the curvature of the curved grating is decreased in the y direction (toward the semiconductor laser chip 21).

In this example, the first and the second optical elements 22A and 23A are formed on the substrate 25. In this example and the following fifth and sixth examples, the optical device with a larger number of optical elements formed on one and the same substrate 25 can be applied to a planar-type optical system in which an optical information processing is performed by utilizing a zigzag optical path within the substrate.

In this example, the reflection layer 26A is provided on the lower face of the substrate 25. Alternatively, the reflection layer 26A may be provided on the upper face of the substrate 25 and the first and second optical elements 22A and 23A may be provided on the lower face of the substrate 25, as is shown in FIGS. 8A and 8B Example 5

Figure 8A:
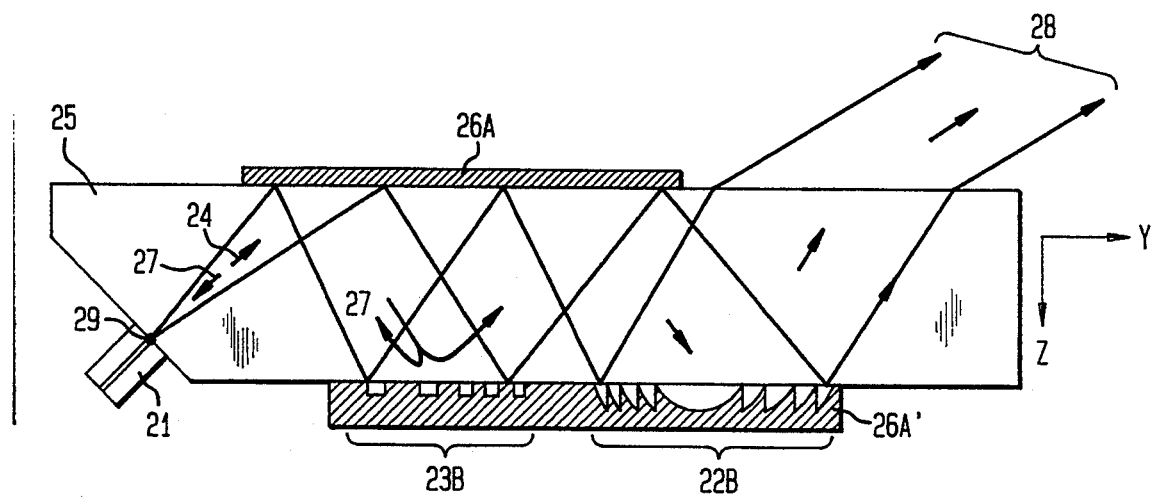
FIG. 8A is a cross-sectional view showing a construction of an optical device of a fifth example according to the invention.
Figure 8B:
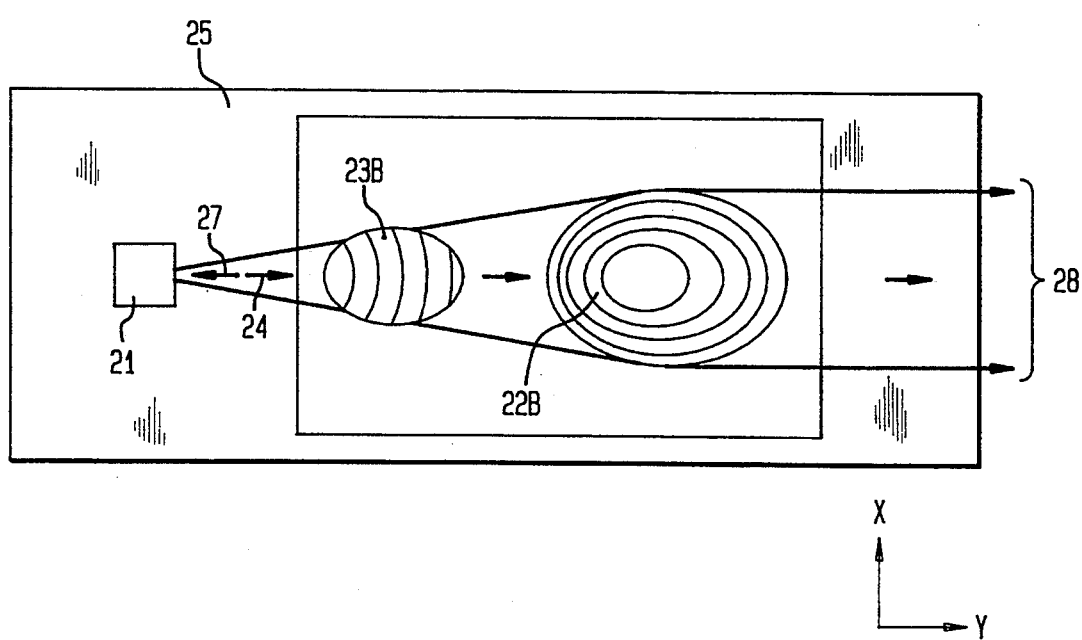
FIG. 8B is a bottom view of the fifth example.

FIGS. 8A and 8B are cross-sectional and bottom views showing a basic construction of an optical device of a fifth example, respectively. The optical device is different from the optical device of the fourth example in the following.

In this example, on the lower face of a substrate 25 having a thickness of, for example, 1.5 mm, a semiconductor laser chip 21, a second optical element 23B, and a first optical element 22B are formed in this order. Laser light 24 emitted from the semiconductor laser chip 21 which is provided on the cut face of the substrate 25 in an oblique manner is propagated through the substrate 25 in a zigzag manner so as to be incident on the second optical element 23B. Reflected first-order diffracted light 27 is propagated back to and incident on a light emitting end face 29 of the semiconductor laser chip 21 in a zigzag manner, so as to stabilize the oscillation wavelength. Zero-order diffracted light (transmitted light) from the second optical element 23B is further propagated through the substrate 25 and incident on the first optical element 22B. The light is collimated by the first optical element 22B and emitted from the surface of the substrate 25 as emitted light 28.

In this example, an optical path length from the semiconductor laser chip 21 to the first optical element 22B as a collimator Lens is increased as compared with the fourth example, so that the thickness of the substrate 25 can be reduced. In addition, since the first optical element 22B only has to have a long focus, the design and the production can easily be performed. Moreover, the size of the second optical element 23B is almost half the size of the first optical element 22B, so that they can be easily formed by the electron-beam lithography.

In this example, the reflection layer 26A is provided on the upper face of the substrate 25. Alternatively, the reflection layer 26A may be provided on the lower face of the substrate 25 and the first and second optical elements 22B and 23B may be provided on the upper face of the substrate 25, as is shown in FIGS. 7A and 7B.

Example 6

Figure 9A:
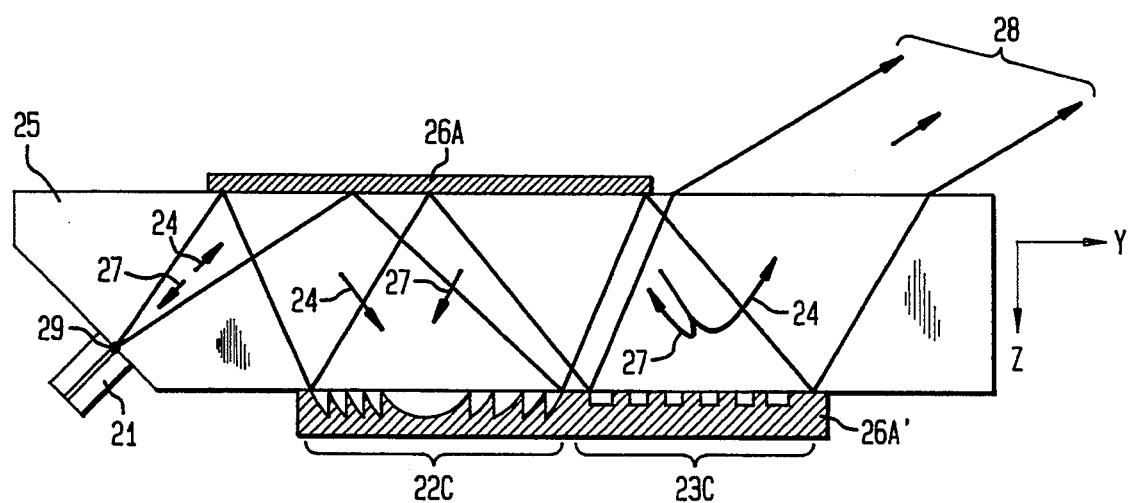
FIG. 9A is a cross-sectional view showing a construction of an optical device of a sixth example and FIG. 9B is a bottom view of the sixth example.
Figure 9B:
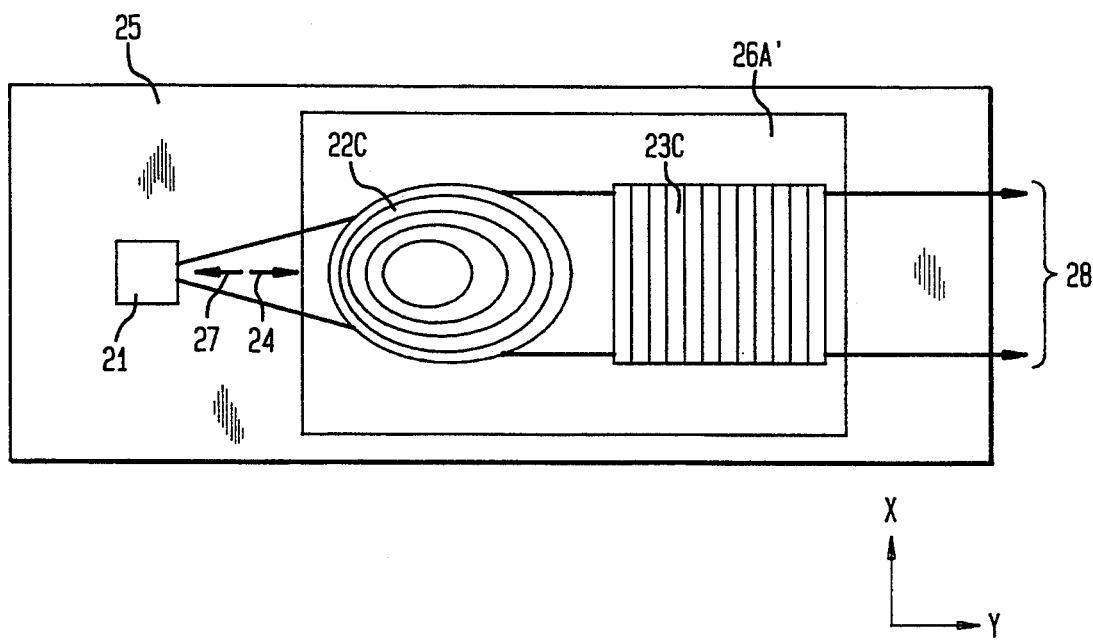

FIGS. 9A and 9B are cross-sectional and bottom views showing the basic construction of an optical device of a sixth example, respectively. The optical device is different from the optical device of the fifth example in the following.

In this example, on the lower face of a substrate 25 having a thickness of, for example, 3 mm, a semiconductor laser chip 21, a first optical element 22C, and a second optical element 23C are arranged in this order. Laser light 24 emitted from the semiconductor laser chip 21 which is provided on the cut face of the substrate 25 in an oblique manner is propagated through the substrate 25 in a zigzag manner so as to be incident on the first optical element 22C. The incident light is collimated by the first optical element 22C. The collimated light is propagated in a zigzag manner, and incident on the second optical element 23C which is a linear grating with a uniform period. A reflected first-order diffracted light beam 27 is propagated back to and incident on a light emitting end face 29 of the semiconductor laser chip 21 in a zigzag manner via the first optical element 22C, so as to stabilize the oscillation wavelength. Zero-order diffracted light (transmitted light) emitted from the second optical element 23C is further propagated through the substrate 25 and emitted from the surface of the substrate 25 as emitted light 28.

In this example, the second optical element 23C only has to be a linear grating with a uniform period, so that the design and the production can be advantageously facilitated as compared with the fifth example.

In this example, the reflection layer 26A is provided on the upper face of the substrate 25. Alternatively, the reflection layer 26A may be provided on the lower face of the substrate 25 and the first and second optical elements 22C and 23C may be provided on the upper face of the substrate 25, as is shown in FIGS. 7A and 7B.

In the third to sixth examples, the optical devices according to the invention are described. Alternatively, if a third optical element or a plurality of optical elements, in addition to the first and the second optical elements, are formed on one and the same substrate, the same effects can be attained. It is appreciated that, other than the optical devices of the above examples, an optical device in which the constructions of the optical devices of the above examples are combined can be constructed, and such an optical device can attain the same effects.

In the fourth to sixth examples, the single reflection layer 26A is provided on the upper face or lower face of the substrate 25. Alternatively, one or more additional reflection layers 26A may be provided on the lower face and/or upper face of the substrate 25, so as to attain a long zigzag propagation of laser light as is shown in FIGS. 10 and 11.

Figure 10:
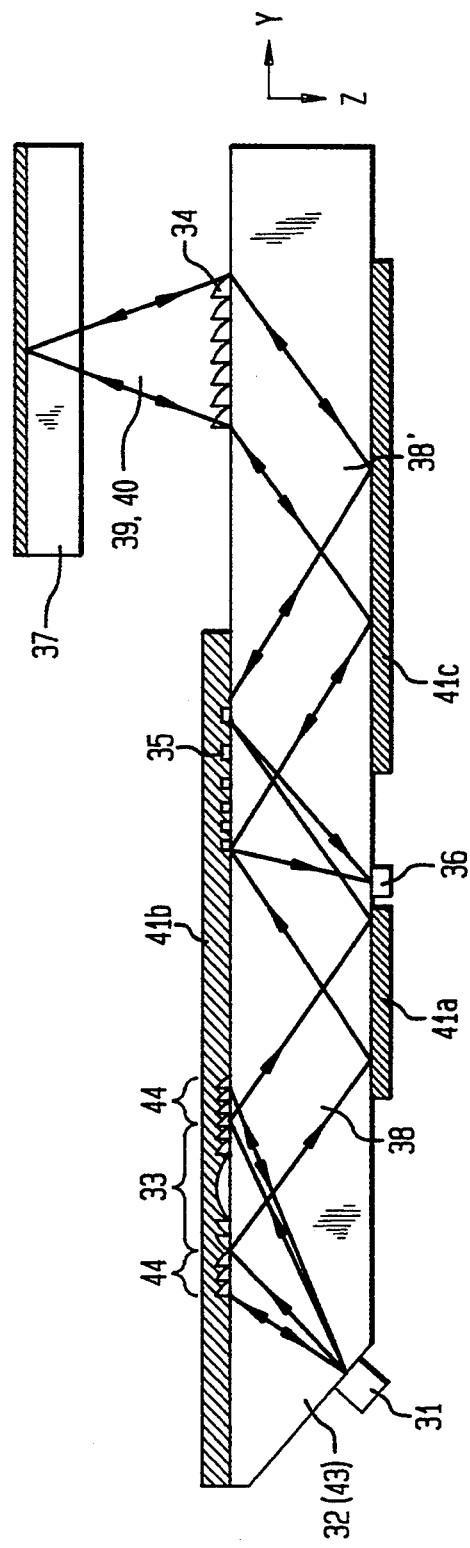
FIG. 10 is a cross-sectional view showing a basic construction of an optical head for an optical disk, to which an optical device of the invention is applied, and showing the light propagation and light convergence.
Figure 11:
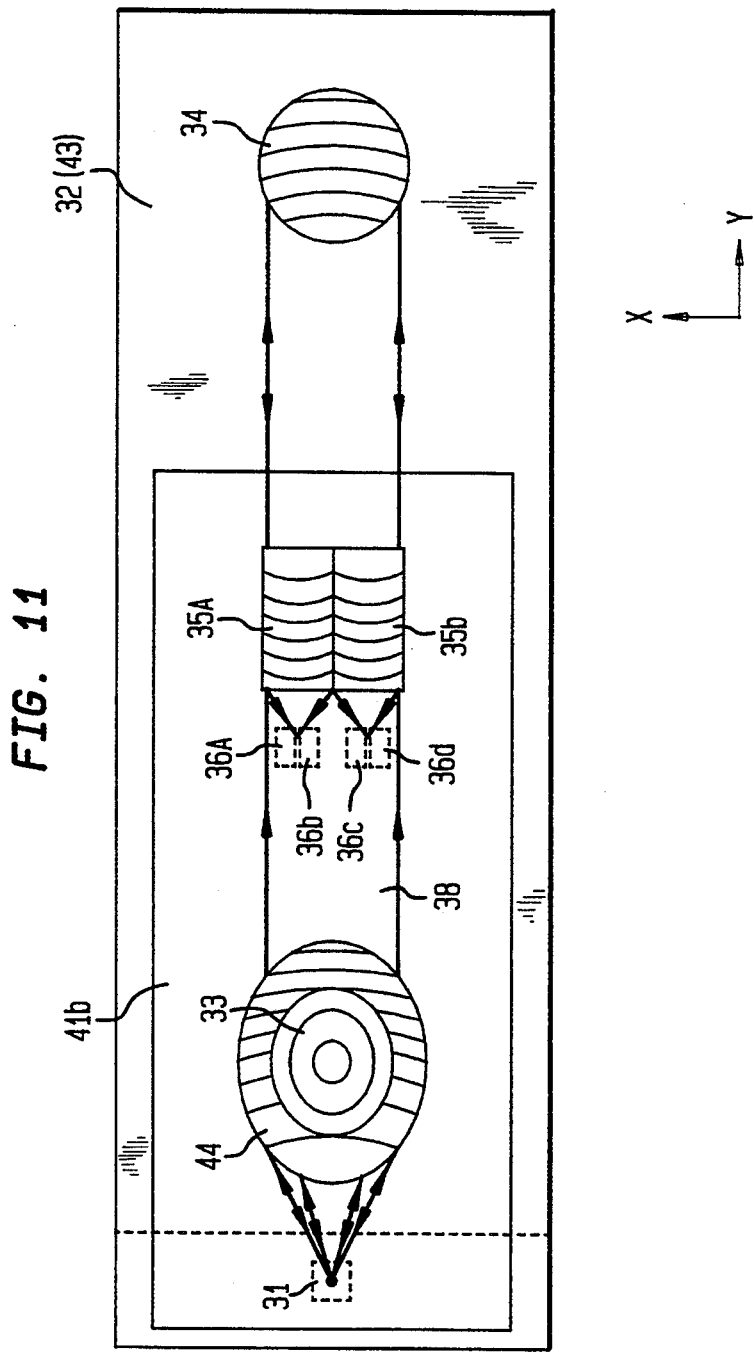
FIG. 11 a plan view showing the construction of the optical head shown in FIG. 10.

Referring to FIGS. 10 and 11, an exemplary optical head for an optical disk, to which an optical device of the invention is applied is described below in detail. In the present specification, "an optical device" includes an optical head. FIGS. 10 and 11 are cross-sectional and plan views showing a basic construction of the optical head, and showing the light propagation and light convergence.

In FIGS. 10 and 11, reflection layers 41a, 41b, and 41c are formed on upper and lower faces of a glass substrate 32. The substrate 32 has, for example, a thickness (in the z direction) of 3 mm, a width (in the x direction) of 10 mm, and a length (in the y direction) of 20 mm. Each of the reflection layers 41a, 41b, and 41c is made of, for example, a metal layer such as Ag, Al or Au, or a multilayer dielectric film. The substrate 32 itself serves as a lightguide 43 through which light is propagated in a zigzag manner by utilizing the reflection at the upper and the lower faces thereof. The substrate 32 is sufficient if it is transparent to the employed wavelength. Especially, a glass substrate such as quartz is thermally stable. As is shown in FIG. 10, the lower left portion of the substrate 32 is obliquely cut away at an angle of 20° with respect to the y direction, and a semiconductor laser chip 31 is disposed on the cut face. A photodetector 36 is disposed on the lower face of the substrate 32.

Laser light having a wavelength of, for example, 0.78 μm is emitted from a light emitting end face of the semiconductor laser chip 31. An optical axis of the laser light is oblique at an angle of, for example, 20° with respect to the z axis. The laser light as propagation light 38 is incident on a reflection collimator lens 33 which is a collimator element having, for example, a focal length of 8.5 mm, and an aperture of 2 mm. The reflection collimator lens 33 reflects and collimates the propagation light 38 while the angle of the optical axis (a propagation angle θ) is maintained (e.g., 20°). The reflection collimator lens 33 is composed of an elliptical grating having a saw-tooth shape in section and the period of the grating is decreased toward the circumference. The center position of the elliptical grating is gradually shifted in the y direction toward the circumference. By using such a collimator lens, the coma and the astigmatism which are usually caused at the oblique incidence can be eliminated, and the obliquely incident light can be collimated without aberrations.

The collimated light having a width of, for example, 2 mm is propagated in a zigzag manner via the reflection layer 41a, a reflection twin lens 35 which is also provided on the lightguide 43, and the reflection layer 41c, and then incident on a transmission objective lens 34. The transmission objective lens is a light converging element, and has, for example, an aperture of 2 mm and a focal length of 2 mm. Then, the propagation light 38 is output from the transmission objective lens 34 as light 39 which is converged on an optical disk 37. Light 40 which is reflected from the optical disk 37 is incident on the transmission objective lens 34, and collimated to be propagation light 38'. The propagation light 38' is propagated in a zigzag manner and incident on the reflection twin lens 35. The reflection twin lens 35 is a positional signal detecting element (focus/track error signal detecting element) covered with the reflection layer 41b and disposed on the lightguide 43. The reflection twin lens 35 has, for example, a length in the x direction of 2 mm, and a length in the y direction of 2 mm, and a focal length of 10 mm. The reflection twin lens 35 has a structure in which reflection lenses 35a and 35b including the same curved grating are arrayed. The propagation light 38' is diffracted by the twin lens 35 and the first-order diffracted light beam is divided into two beams which are in turn converged on the photodetector 36.

The reflection collimator lens 33 is, for example, an inline type reflection diffractive optical lens having a maximum groove depth of 0.28 μm. The transmission objective lens 34 is, for example, an off-axis type transmission diffractive optical lens having a maximum groove depth of 1.3 μm. The reflection twin lens 35 is of an off-axis type and has a maximum groove depth of, for example, 0.12 μm. The above optical elements are all diffractive optical elements for performing convergence by utilizing the optical diffraction phenomenon. In this example, the inline type diffractive optical lens is a lens for which the angle of the optical axis of light incident thereon is equal to the angle of the optical axis of light emitted therefrom. The off-axis type diffractive optical lens is a lens for which the angle of the optical axis of light incident thereon is different from the angle of the optical axis of light emitted therefrom. Such diffractive optical elements can be accurately positioned and integrated on the lightguide 43 by a known planar technique. In addition, the size and the weight thereof are reduced and the characteristics thereof are stabilized.

These diffractive optical elements 33, 34, 35 and 44 are produced by the following method. An electron-beam resist made of, for example, PMMA, CMS or the like is first spin-coated on the glass substrate 32. Then, an electron-beam lithography in which the irradiation amount (electron dose) is controlled depending on the film thickness of each element to be produced is performed. Then, development is performed, so that the resist has various film thicknesses. By using the optical element thus formed (original), a metal mold thereof is produced by, for example, a nickel electroforming method. For example, by using a UV-setting resin, the lenses 33, 34, 35 and 44 the same as the original are duplicated on the lightguide 43. According to this method, four diffractive optical lenses 33, 34, 35 and 44 can simultaneously and easily be formed on the lightguide 43 by using the same material with highly accurate positioning. After the duplication, on the reflection diffractive lenses 33, 35, and 44, a metal layer, for example, of Ag, Al, Au or the like is deposited as the reflection layer 41b.

If a metal layer of Cu, Cr or the like, a synthetic resin such as a UV-setting resin and a lacquer, a dielectric multilayer film, SiO, $SiO_2$, $MgF_2$, SiC, graphite, diamond, or the like is deposited on the reflection layer 41b so as to have a thickness of, for example, 1000 Å to several μm, the surface of the reflection layer is not likely to be damaged, and the oxidation of the reflection layer can be prevented. Thus, it is possible to improve the environmental resistance. Especially in the case where Ag is used as a material of the reflection layer, the reflection layer is easily oxidized. Therefore, in such a case, the provision of an additional layer on the reflection layer attains great effects.

Signals recorded on the optical disk 37 can be reproduced from the sum of the outputs of the division photodetector 36 (36a+36b+36c+36d).

By using the positional signal detecting element 35, a focus error signal and a tracking error signal can be detected. The detection of the focus error signal utilizes a known Foucault method. Specifically, when the optical disk 37 is positioned at the just focus position, the divided photodetectors 36a, 36b, 36c and 36d are arranged in such a manner that the two divided propagation light beams which are divided by the reflection twin lens 35 are converged on the border between 36a and 36b and on the border between 36c and 36d, respectively. The focus error signal is the difference between the output of the photodetector 36a and the output of the photodetector 36b (36a–36b), or the difference between the output of the photodetector 36d and the output of the photodetector 36c (36d–36c). Therefore, when the optical disk 37 is positioned at the just focus position, the focus error signal is obtained as 0. If the optical disk 37 moves away from the just focus position in the −z axis direction, the propagation light 38' is changed from the collimated light to a converging spherical wave. Therefore, the two divided propagation light beams travel so as to be close to each other, so that the focus error signal becomes negative. If the optical disk 37 comes closer from the just focus position in the z direction, the propagation light 38' is changed to be a diverging spherical wave. Therefore, the two divided propagation light beams travel so as to be away from each other, so that the focus error signal becomes positive. Accordingly, by using the focus error signal, a focus control can be performed.

The tracking error signal can be detected by a known push-pull method. Specifically, the tracking error signal can be detected as a difference in optical power between the two divided propagation light beams by calculating the outputs of the photodetectors (36a+36b−36c−36d). If the calculated result is 0, this indicates the just tracking. If the calculated result has a value other than 0, the tracking is deviated. A tracking control can be performed based on the signal.

The focus control and the tracking control are performed by moving the entire substrate 32 on which various optical elements are provided to an optimum position with an actuator, based on the respective detected error signals.

In the optical head described above, each of the width and the thickness of the lightguide 43 is, for example, in the order of 500 times of the wavelength or more, so that light can be treated on the basis of geometrical optics, i.e., light is propagated in a zigzag manner as a ray.

In this example, since the wavelength select lens 44 is formed in the shape of ring around the reflection collimator lens 33, the wavelength of the laser light emitted from the semiconductor laser chip 31 is stabilized for the reasons described above.

In this example, the arrangement of the first and second optical elements which is similar to that of the fourth example is employed (see FIGS. 7A, 7B, 10 and 11). Alternatively, the arrangement of the first and second optical elements which is similar to that of the fifth or sixth example may be employed.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor laser device comprising:
   a semiconductor laser chip having an emitting end face for emitting laser light;
   an optical device allowing said laser light to transmit therethrough; and
   a supporting member for supporting said semiconductor laser chip and said optical device in an arrangement such that said laser light emitted from said emitting end face of said semiconductor laser chip is incident on said optical device,
   wherein said optical device includes a reflection diffractive optical means, and
   wherein said reflection diffractive optical means diffracts part of said laser light emitted from said emitting end face of said semiconductor laser chip, to form diffracted light beams, and allows a diffracted light beam having a selected wavelength among said diffracted light beams to be incident on said emitting end face.

2. A semiconductor laser device according to claim 1, wherein said part of said laser light diffracted by said reflection diffractive optical means is light in the peripheral portion of said laser light.

3. A semiconductor laser device according to claim 2, wherein said optical device further includes a transparent plate, and wherein said reflection diffractive optical means is a lens formed on a surface of said transparent plate, said lens being a ring-shaped lens having an opening.

4. A semiconductor laser device according to claim 3, wherein said optical device further includes another optical means provided in said opening of said ring-shaped lens.

5. A semiconductor laser device according to claim 3, wherein said transparent plate is disposed substantially parallel to said emitting end face of said semiconductor laser chip.

6. A semiconductor laser device according to claim 3, wherein said supporting member has a portion for supporting said semiconductor laser chip, and a cap provided on said portion to cover said semiconductor laser chip, said cap having an opening for allowing at least part of said laser light emitted from said emitting end face of said semiconductor laser chip.

7. A semiconductor laser device according to claim 6, wherein said transparent plate is provided on the inner side of said cap to cover said opening of said cap.

8. A semiconductor laser device according to claim 7, wherein, in said cap, said reflection diffractive optical lens faces said emitting end face of said semiconductor laser chip.

9. A semiconductor laser device according to claim 7, wherein said reflection diffractive optical lens is provided on one face of a pair of faces of said transparent plate, said one face not facing said emitting end face of said semiconductor laser chip.

10. A semiconductor laser device according to claim 6, wherein said transparent plate is provided on the outer side of said cap to cover said opening of said cap.

11. A semiconductor laser device according to claim 1, wherein said semiconductor laser chip includes another end face parallel to said emitting end face, said end face having a higher reflectance than that of said emitting end face.

12. A semiconductor laser device according to claim 1, wherein a power ratio of light allowed to be incident on said emitting end face by said reflection diffractive optical means to laser light oscillated in said semiconductor laser chip is equal to or larger than a reflectance of said emitting end face of said semiconductor laser chip.

13. An optical device comprising:
   a substrate having a first main face and a second main face;
   a first optical element formed on either one main face of said first main face or said second main face of said substrate;and
   a second optical element formed on said main face together with said first optical element,
   wherein said second optical element has a reflection diffractive grating structure, said second optical element receiving part of laser light emitted from an emitting end face of a semiconductor laser chip, reflecting and diffracting said part of said laser light to form a plurality of orders of diffracted light beams, and allowing diffracted light beams having a selected wavelength among said plurality of orders of diffracted light beams to be incident on said emitting end face of said semiconductor laser chip.

14. An optical device according to claim 13, wherein said second optical element is formed around said first optical element.

15. An optical device according to claim 13, wherein said first optical element is an optical element having a diffractive grating structure.

16. An optical device according to claim 15, wherein said first optical element is a transmission element, and wherein said first optical element receives part of said laser light, and emits said part of said laser light to the external of said substrate.

17. An optical device according to claims 16 or 14, wherein said first optical element is a micro Fresnel lens.

18. An optical device according to claim 15, wherein said first optical element is a reflection element, and wherein said first optical element receives part of said laser light and reflects said part of said laser light in a direction in which said semiconductor laser chip is not disposed.

19. An optical device according to claim 18, wherein an angle formed by said main face on which said first and second optical elements are formed and said emitting end face of said semiconductor laser chip is smaller than 90°.

20. An optical device according to claim 19, wherein said second optical element is formed around said first optical element.

21. An optical device according to claim 20, further comprising:
reflection means on the other one of said first or second main face on which said first and second optical elements are not formed;
an objective lens formed on said substrate, said objective lens receiving said laser light propagated in a zigzag manner via said reflection means, and converging said laser light onto an optical information recording medium; and
photodetector means for detecting light reflected by said optical information recording medium, said photodetector means producing a signal which includes information recorded on said information recording medium.

22. An optical device according to claim 21, further comprising positional signal detecting means formed on said substrate, said positional signal detecting means receiving said light reflected by said optical information recording medium, and dividing said light into a plurality of portions,
wherein said photodetector means includes at least four photodetectors, said photodetectors receiving said plurality of portions of said light, and producing a positional signal based on said plurality of portions of said light.

23. An optical device according to claim 19, wherein said second optical element is formed at a distant position from said first optical element.

24. An optical device according to claim 23, further comprising:
reflection means on the other one of said first or second main face on which said first and second optical elements are not formed;
an objective lens formed on said substrate, said objective lens receiving said laser light propagated in a zigzag manner via said reflection means, and converging said laser light onto an optical information recording medium; and
photodetector means for detecting light reflected by said optical information recording medium, said photodetector means producing a signal which includes information recorded on said information recording medium.

25. An optical device according to claim 24, further comprising positional signal detecting means formed on said substrate, said positional signal detecting means receiving said light reflected by said optical information recording medium, and dividing said light into a plurality of portions,
wherein said photodetector means includes at least four photodetectors, said photodetectors receiving said plurality of portions of said light, and producing a positional signal based on said plurality of portions of said light.

26. An optical device according to claim 23, further comprising reflection means on the other one of said first or second main face on which said first and second optical elements are not formed,
wherein said second optical element receives said part of said laser light emitted from said emitting end face of said semiconductor laser chip, and allowing said diffracted light beams having the selected wavelength among said plurality of orders of diffracted light beams to be incident on said emitting end face of said semiconductor laser chip.

27. An optical device according to claim 26, wherein said reflection means receives zero-order diffracted light beams among said plurality of orders of diffracted light beams from said second optical element, and reflects said zero-order diffracted light beams, whereby said zero-order diffracted light beams are allowed to be incident on said first optical element.

28. An optical device according to claim 23, further comprising reflection means on the other one of said first and second main faces on which said first and second optical elements are not formed,
wherein said first optical element receives said laser light emitted from said emitting end face of said semiconductor laser chip via said reflection means, and collimates said laser light to be parallel light, and
wherein said second optical element receives said parallel light via said reflection means to form said plurality of orders of said diffracted light beams, and allows said diffracted light beams having the selected wavelength among said plurality of orders of diffracted light beams to be incident on said emitting end face of said semiconductor laser chip via said reflection means and said first optical element.

29. An optical device according to claim 23, further comprising reflection means on the other one of said first and second main faces on which said first and second optical elements are not formed,
wherein said first optical element receives said laser light emitted from said emitting end face of said semiconductor laser chip, and collimates said laser light to be parallel light, and
wherein said second optical element receives said parallel light via said reflection means to form said plurality of orders of said diffracted light beams, and allows said diffracted light beams having the selected wavelength among said plurality of orders of diffracted light beams to be incident on said emitting end face of said semiconductor laser chip via said reflection means and said first optical element.

30. An optical device according to claim 23, further comprising reflection means on the other one of said first or second main face on which said first and second optical elements are not formed,
wherein said second optical element receives said part of said laser light emitted from said emitting end face of said semiconductor laser chip via said reflection means, and allowing said diffracted light beams having the selected wavelength among said plurality of orders of diffracted light beams to be incident on said emitting end face of said semiconductor laser chip via said reflection means.

31. An optical device according to claim 30, wherein said reflection means receives zero-order diffracted light beams among said plurality of orders of diffracted light beams from said second optical element, and reflects said zero-order diffracted light beams, whereby said zero-order diffracted light beams are allowed to be incident on said first optical element.

32. An optical device according to claim 31, wherein said first optical element forms other diffracted light beams from said zero-order diffracted light beams which are received from said second optical element via said reflection means, and emits said other diffracted light beams to the external of said substrate.

33. An optical device according to claim 32, wherein said second optical element is a linear grating having a uniform period.

34. An optical device according to claim 31, wherein said first optical element forms other diffracted light beams from said zero-order diffracted light beams which are received from said second optical element via said reflection means.

35. An optical device according to claim 13, wherein said laser light emitted from said emitting end face of said semiconductor laser chip is elliptical in section perpendicular to an emitting direction, and
  wherein said main face of said first or second main face of said substrate on which said first and second optical elements are formed is perpendicular to the plane which includes both a major axis of said ellipse and said emitting direction.

36. An optical device according to claim 13, wherein a power ratio of light allowed to be incident on said emitting end face by said second optical element to laser light oscillated in said semiconductor laser chip is equal to or larger than a reflectance of said emitting end face of said semiconductor laser chip.

* * * * *

UNITED STATES PATENT AND TRADE MARK OFFICE
CERTIFICATE OF CORRECTION

PATENT NO. : 5,373,519
DATED : December 13, 1994
INVENTOR(S) : Siono et al.

It is certified that error appears in the above-identified patent and that said Letters Patent is hereby corrected as shown below:

On the cover page, delete "Siono et al." and insert therefor –Shiono et al.--

In Field [75], after "Teruhiro" delete "Siono" and insert therefor –Shiono--.

Signed and Sealed this

Sixth Day of October, 1998

Attest:

BRUCE LEHMAN

Attesting Officer    Commissioner of Patents and Trademarks